US012575159B2

(12) United States Patent
Lee

(10) Patent No.: US 12,575,159 B2
(45) Date of Patent: Mar. 10, 2026

(54) HIGH VOLTAGE SEMICONDUCTOR DEVICE AND METHOD OF MANUFACTURING SAME

(71) Applicant: DB HiTek Co., Ltd., Bucheon-si (KR)

(72) Inventor: Jong Ho Lee, Incheon (KR)

(73) Assignee: DB HiTek Co., Ltd., Bucheon-si (KR)

( * ) Notice: Subject to any disclaimer, the term of this patent is extended or adjusted under 35 U.S.C. 154(b) by 421 days.

(21) Appl. No.: 18/332,795

(22) Filed: Jun. 12, 2023

(65) Prior Publication Data

US 2024/0332375 A1     Oct. 3, 2024

(30) Foreign Application Priority Data

Mar. 30, 2023     (KR) ........................ 10-2023-0041618

(51) Int. Cl.
| | |
|---|---|
| *H10D 64/00* | (2025.01) |
| *H10D 1/47* | (2025.01) |
| *H10D 30/01* | (2025.01) |
| *H10D 30/65* | (2025.01) |
| *H10D 62/10* | (2025.01) |

(52) U.S. Cl.
CPC ............. *H10D 64/111* (2025.01); *H10D 1/47* (2025.01); *H10D 30/0281* (2025.01); *H10D 30/65* (2025.01); *H10D 62/102* (2025.01)

(58) Field of Classification Search
CPC ................ H10D 64/111; H10D 64/112; H10D 30/0281; H10D 30/65; H10D 1/47
See application file for complete search history.

(56) References Cited

U.S. PATENT DOCUMENTS

| | | | | |
|---|---|---|---|---|
| 8,754,474 | B2 | 6/2014 | Ko | |
| 2012/0126322 | A1 | 5/2012 | Ko | |
| 2013/0032895 | A1* | 2/2013 | Disney ................. | H10D 64/115 |
| | | | | 257/E21.409 |
| 2016/0276425 | A1* | 9/2016 | Saito ......................... | H10D 1/47 |
| 2017/0104097 | A1* | 4/2017 | Park ..................... | H10D 30/603 |
| 2020/0126990 | A1* | 4/2020 | Zhang ................. | H10D 30/603 |

FOREIGN PATENT DOCUMENTS

KR      10-2012-0055139 A      5/2012

* cited by examiner

*Primary Examiner* — Monica D Harrison
*Assistant Examiner* — Jacob T Nelson
(74) *Attorney, Agent, or Firm* — Central California IP Group, P.C.; Andrew D. Fortney

(57)     ABSTRACT

Disclosed are a high voltage semiconductor device and a method of manufacturing the same. More particularly, a high voltage semiconductor device and a method of manufacturing the same include a metal field plate, which may be manufactured substantially simultaneously with a thin film resistor (TFR) (e.g., in the same process step[s] or sequence), between a source metal and a gate electrode.

19 Claims, 19 Drawing Sheets

910

9

A1

A2

920

1

HIGH VOLTAGE SEMICONDUCTOR DEVICE AND METHOD OF MANUFACTURING SAME

CROSS REFERENCE TO RELATED APPLICATION

The present application claims priority to Korean Patent Application No. 10-2023-0041618, filed Mar. 30, 2023, the entire contents of which are incorporated herein for all purposes by this reference.

BACKGROUND OF THE INVENTION

Field of the Invention

The present disclosure relates generally to a high voltage semiconductor device and a method of manufacturing the same. More particularly, the present disclosure relates to a high voltage semiconductor device and a method of manufacturing the same, including a metal field plate, which may be manufactured substantially simultaneously with a thin film resistor (TFR) (e.g., in the same process step[s] or sequence), between a source metal and a gate electrode, to improve peak electric field dispersion and breakdown voltage characteristics.

Description of the Related Art

A lateral double diffused metal oxide semiconductor (LDMOS) is a representative horizontal type electric device with a fast switching response and high input impedance. In particular, recently, demand for high-voltage devices of 100 V or more has increased in the automotive semiconductor market.

FIGS. 1 to 3 are cross-sectional views illustrating a conventional high voltage semiconductor device 9.

Hereinafter, the structure and problems of the conventional high voltage semiconductor device 9 for electric field dispersion, and a high voltage semiconductor device 1 according to an embodiment of the present disclosure for solving the problems, will be described.

Referring to FIG. 1, in a region of the conventional high voltage semiconductor device 9 having a low operating voltage (Vop) (e.g., equal to or less than 30 V), a gate field plate 920 is below a gate electrode 910 to prevent electric field concentration at an edge of the gate electrode 910. With this structure, peak electric fields may be generated at an edge A1 of the gate field plate 920 below the gate electrode 910 and at an edge A2 of the gate electrode 910, so the electric field is dispersed.

In addition, referring to FIG. 2, in a region of the conventional high voltage semiconductor device 9 having a medium operating voltage (Vop) (e.g., 40 V to 100 V), the gate field plate 920 is below a gate electrode 910, a poly field plate 930 is on the gate field plate 920, and a source metal 950 is electrically connected to a source 940. The source metal 950 may extend laterally. Alternatively, as illustrated, the source metal 950 may be physically connected to a source contact, and a metal field plate 960 may be electrically connected to and spaced apart from the source metal 950. With this structure, peak electric fields may be generated at an edge B1 of the gate field plate 920 below the gate electrode 910, an edge B2 of the gate electrode 910, an edge B3 of the poly field plate 930, and an edge B4 of the metal field plate 960, so the electric field is dispersed.

Lastly, referring to FIG. 3, in a region of the conventional high voltage semiconductor device 9 having a high operating voltage (Vop) (e.g., equal to or greater than 100 V), an additional source metal 980 (hereinafter referred to as a second source metal 980) is on or over a source metal 970 (hereinafter referred to as a first source metal 970). The second source metal 980 may extend farther than the first source metal 970 (e.g., over the gate field plate 920). With this structure, peak electric fields may be generated at an edge C1 of a gate field plate 920 below a gate electrode 910, an edge C2 of the gate electrode 910, an edge C3 of the first source metal 970, and an edge C4 of the second source metal 980, so the electric field is dispersed.

As described above, in the conventional high voltage semiconductor device 9, additional configurations or structures may be formed in separate processes in order to achieve peak electric field dispersion. This may decrease process efficiency. That is, additional processes are used to form the poly field plate 930 on the gate field plate 920, the metal field plate 960, and the second source metal 980.

To overcome the above problem, the present inventors have conceived a novel high voltage semiconductor device having an improved structure and a method of manufacturing the same, which will be described in detail later.

The foregoing is intended merely to aid in the understanding of the background of the present disclosure, and is not intended to mean that the present disclosure falls within the purview of the related art that is already known to those skilled in the art.

Documents of Related Art

Korean Patent Application Publication No. 10-2012-0055139, entitled "LDMOS semiconductor device."

SUMMARY OF THE INVENTION

Accordingly, the present disclosure has been made keeping in mind the above problems occurring in the related art, and an objective of the present disclosure is to provide a high voltage semiconductor device and a method of manufacturing the same, including a metal field plate between a source metal and a gate electrode to improve peak electric field dispersion and breakdown voltage characteristics.

Another objective of the present disclosure is to provide a high voltage semiconductor device and a method of manufacturing the same, including a metal field plate crossing a gate electrode to efficiently disperse a peak electric field.

Another objective of the present disclosure is to provide a high voltage semiconductor device and a method of manufacturing the same, including a metal field plate formed substantially simultaneously with a thin film resistor (e.g., in the same process step[s] or sequence) to avoid additional process(es) and maintain or improve process efficiency.

In order to achieve the above objectives, according to one aspect of the present disclosure, there is provided a high voltage semiconductor device including a substrate; a drift region in the substrate; a body region in the substrate; a drain in the drift region; a source in the body region; a gate electrode on the substrate; a source contact on the substrate and connected to the source; a drain contact on the substrate and connected to the drain; a source electrode connected to the source contact; a drain electrode connected to the drain contact and spaced apart from the source electrode; and a metal field plate between the source electrode and the gate electrode.

According to another aspect of the present disclosure, the metal field plate may be electrically connected to the source contact.

According to another aspect of the present disclosure, the metal field plate may have an end between the gate electrode and the drain contact.

According to another aspect of the present disclosure, the metal field plate may cross the gate electrode at a position above the gate electrode and may be spaced apart from the drain contact and the drain electrode.

According to another aspect of the present disclosure, there is provided a high voltage semiconductor device including a substrate; a drift region in the substrate; a body region in the substrate; a drain in the drift region; a source in the body region; a gate electrode on the substrate; a first insulating layer on the substrate and covering the gate electrode; a source contact in the first insulating layer and connected to the source and a source electrode; a drain contact in the first insulating layer and connected to the drain and a drain electrode; a metal field plate in the first insulating layer and electrically connected to the source contact; a wiring layer on the substrate or the first insulating layer, and a thin film resistor in the first insulating layer and spaced apart from the metal field plate.

According to another aspect of the present disclosure, the metal field plate may have a substantially identical chemical composition and thickness as the thin film resistor (e.g., it may be formed substantially simultaneously with the thin film resistor).

According to another aspect of the present disclosure, the high voltage semiconductor may further include a drain extension in the drift region. Here, the drain may be in the drain extension.

According to another aspect of the present disclosure, the metal field plate may be at a substantially same height as the thin film resistor.

According to another aspect of the present disclosure, the metal field plate may be thinner than the source electrode.

According to another aspect of the present disclosure, the metal field plate may be spaced apart from an upper surface of the gate electrode.

According to another aspect of the present disclosure, the wiring layer may include a first wiring layer on the first insulating layer; and a second wiring layer on a second insulating layer, and the thin film resistor may be connected to the first wiring layer by a via or contact in the first insulating layer.

According to another aspect of the present disclosure, the high voltage semiconductor device may further include a body contact in the body region and in contact with the source.

According to another aspect of the present disclosure, there is provided a method of manufacturing a high voltage semiconductor device, the method including forming a drift region and a body region in a substrate; forming a device isolation layer in the substrate; forming a gate insulating layer and a gate electrode on the substrate; forming a drain in the drift region and a source in the body region; forming a lower insulating layer on the substrate to cover the gate electrode; forming a metal field plate on the lower insulating layer; forming an upper insulating layer on the lower insu- lating layer to cover the metal field plate; forming a contact hole in the upper and lower insulating layers; forming a source contact in the contact hole; and forming a source metal on the upper insulating layer, connected to the source contact.

According to another aspect of the present disclosure, the metal field plate may be electrically connected to the source contact.

According to another aspect of the present disclosure, the metal field plate may have an end between the drain and the gate electrode.

According to another aspect of the present disclosure, the metal field plate may have a thickness from 30 Å to 1000 Å.

According to another aspect of the present disclosure, there is provided a method of manufacturing a high voltage semiconductor device, the method including forming a drift region and a body region in a substrate; forming a device isolation layer in the substrate; forming a gate insulating layer and a gate electrode on the substrate; forming a drain in the drift region and a source in the body region; forming a lower insulating layer (e.g., of a first insulating layer) on the substrate to cover the gate electrode; forming a metal field plate and a thin film resistor spaced apart from the metal field plate on the lower insulating layer; forming an upper insulating layer (e.g., of the first insulating layer) on the lower insulating layer to cover the metal field plate and the thin film resistor; forming a source contact and a drain contact in the upper and lower insulating layers and a via contact spaced apart from the source contact and the drain contact in the upper insulating layer; and forming a source metal, a drain metal, and a first wiring layer spaced apart from each other on the upper insulating layer.

According to another aspect of the present disclosure, the metal field plate may overlap the gate electrode.

The above configurations may have the following effects.

According to the present disclosure, the metal field plate between the source metal and the gate electrode can improve peak electric field dispersion and breakdown voltage char- acteristics.

In addition, the metal field plate crossing the gate elec- trode can efficiently disperse the peak electric field.

In addition, forming the metal field plate substantially simultaneously with the thin film resistor (e.g., in the same process step[s] or sequence) avoids additional process(es) and thus maintains process efficiency.

Meanwhile, the effects of the present disclosure are not limited to the effects described above, and other effects not stated directly can be understood from the following description and claims.

BRIEF DESCRIPTION OF THE DRAWINGS

The above and other objectives, features, and other advan- tages of the present disclosure will be more clearly under- stood from the following detailed description when taken in conjunction with the accompanying drawings, in which.

DETAILED DESCRIPTION OF THE INVENTION

Figure 1:
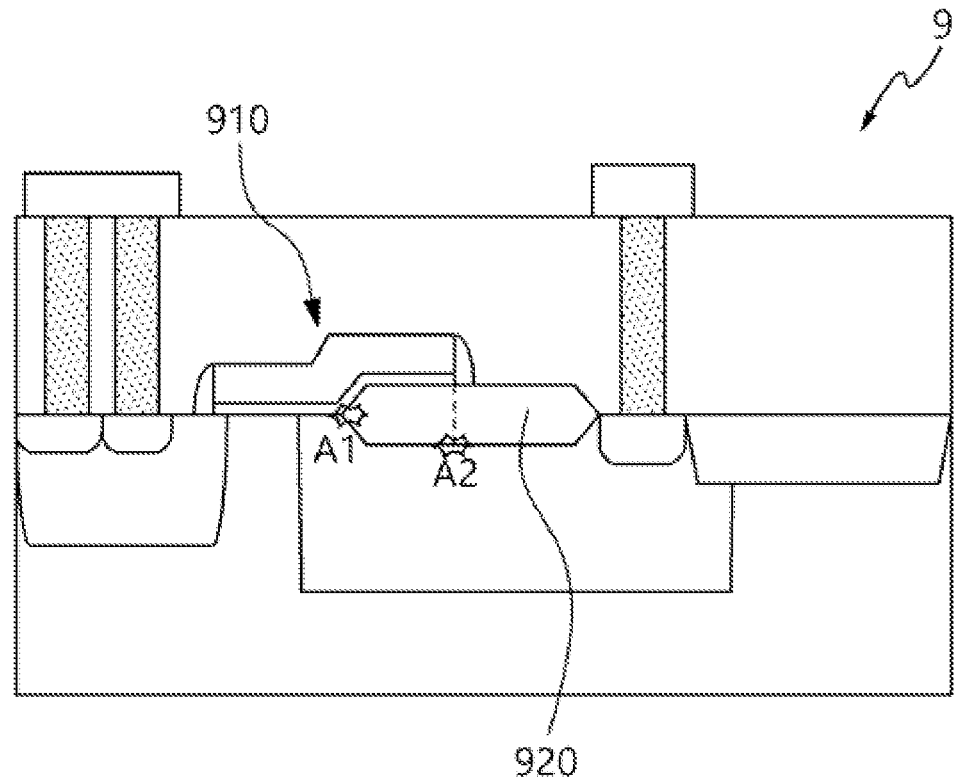
FIGS. 1 to 3 are cross-sectional views illustrating a conventional high voltage semiconductor device.

Hereinafter, exemplary embodiments of the present dis- closure will be described in more detail with reference to the accompanying drawings. The embodiments of the present disclosure can be modified in various forms. Therefore, the scope of the present disclosure should not be construed as being limited to the following embodiments, but should be construed on the basis of the descriptions in the appended claims. The embodiments of the present disclosure are provided for complete disclosure of the present disclosure and to fully convey the scope of the present disclosure to those skilled in the art.

As used herein, when an element (or layer) is referred to as being on another element (or layer), it can be directly on the other element, or one or more intervening elements (or layers) may be therebetween. In contrast, when an element is referred to as being directly on or above another element, no intervening elements are therebetween. Further, the terms "on", "above", "below", "upper", "lower", "one side", "side surface", etc. may describe one element's relationship to one or more other elements illustrated in the drawings.

While the terms "first", "second", etc. may be used herein to describe various items such as various elements, regions and/or parts, these items should not be limited by these terms.

When a certain embodiment may be implemented differently, a specific process order may be performed differently from the described order. For example, two consecutively described processes may be performed substantially at the same time or in an order opposite to the described order.

The term "metal-oxide-semiconductor (MOS)" used herein is a general term. "M" is not limited to only metal, and may include various types of conductors. "S" may refer to a substrate or a semiconductor structure. "O" is not limited to only oxide, and may include various types of organic or inorganic dielectric materials.

In addition, the conductivity type or dopant type of a region, component or element may be defined as "P-type" or "N-type" according to the main carrier characteristics. However, this is only for convenience of description, and the technical spirit of the present disclosure is not limited to the above-mentioned examples. For example, "P-type" or "N-type" may be hereinafter replaced with the more general terms "first conductivity type" or "second conductivity type". Here, first conductivity type may refer to P type, and second conductivity type may refer to N type.

It should be further understood that the terms "heavily doped" and "lightly doped" referring to or representing the dopant concentration of an impurity region may mean the relative concentration of dopant elements in the corresponding region(s) or component(s).

A high voltage semiconductor device described below may be, for example, an LDMOS device.

Figure 4:
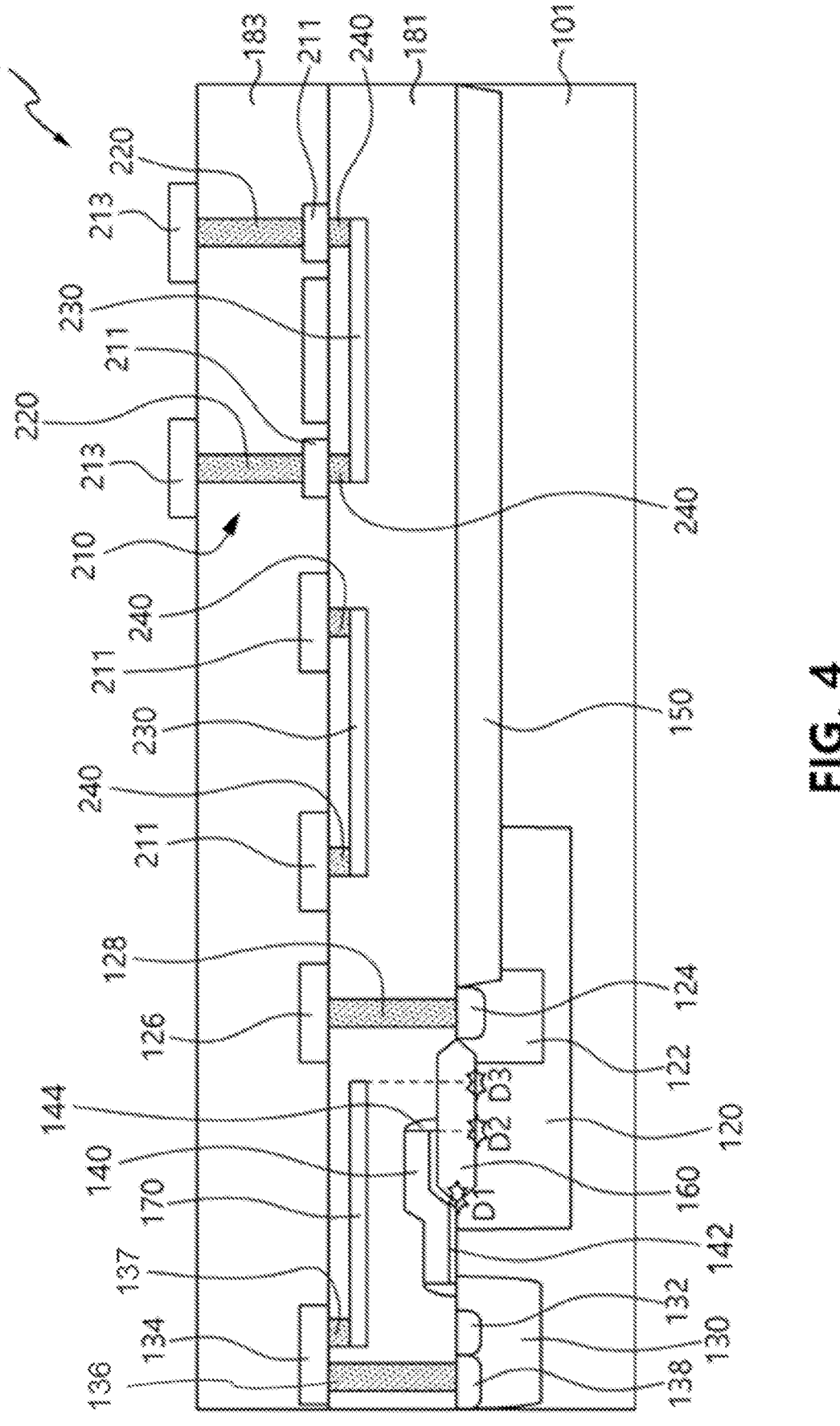
FIG. 4 is a cross-sectional view illustrating an exemplary high voltage semiconductor device according to an embodi- ment of the present disclosure.

FIG. 4 is a cross-sectional view illustrating an exemplary high voltage semiconductor device 1 according to an embodiment of the present disclosure.

Hereinafter, the high voltage semiconductor device 1 according to an embodiment of the present disclosure will be described in detail with reference to the accompanying drawings.

Referring to FIG. 4, the present disclosure relates to the high voltage semiconductor device 1. More particularly, the present disclosure relates to the high voltage semiconductor device 1, including a metal field plate, which may be manufactured substantially simultaneously with a thin film resistor (TFR) (e.g., in the same process step[s] or sequence), between a source metal and a gate electrode to improve peak electric field dispersion and breakdown voltage characteristics.

The high voltage semiconductor device 1 may include a substrate 101. In the substrate 101, a well region may define at least in part an active region of high voltage semiconductor device 1. The active region may be (further) defined by a device isolation region 150. The substrate 101 may comprise a single-crystal silicon substrate having a first conductivity type, a P-type diffusion region on such a substrate, or a P-type epitaxial layer (e.g., formed by epitaxial growth) on such a substrate. The device isolation layer 150 may comprise a shallow trench isolation (STI) structure, but is not limited thereto.

A drift region 120 may be in the substrate 101. The drift region 120 may be in contact with or spaced apart from the body region 130, which will be described later, or may extend to a position in contact with or overlapping the device isolation layer 150 adjacent thereto. However, the scope of the present disclosure is not limited thereto. In addition, when the dopant concentration in the drift region 120 is equal to or less than a certain level, the on-resistance (Rsp) characteristics may deteriorate. On the contrary, when the dopant concentration is equal to or greater than a certain level, the on-resistance (Rsp) characteristics improve, but the breakdown voltage characteristics may deteriorate. In view of this, it is preferable for the drift region 120 to have an appropriate dopant concentration level considering the corresponding electrical characteristics. The drift region 120 may comprise, for example, a second conductivity type impurity region, and preferably has a lower dopant concentration than a drain 124, which will be described later.

A drain extension 122 may be in the drift region 120. That is, the drift region 120 may surround the drain extension 122. The drain extension 122 may comprise a second conductivity type impurity region, and preferably has a higher dopant concentration than the drift region 120. The drain extension 122 can improve the breakdown voltage characteristics of the device 1. A drain 124 may be in the drain extension 122 and/or in the substrate 101. The drain 124 may comprise a heavily doped second conductivity type impurity region, and preferably has a higher dopant concentration than the drain extension 122. Also, the drain 124 may be, for example, between a gate field plate 160 and the device isolation layer 150.

The drain 124 may be electrically connected to a drain metal (or electrode) 126 on a first insulating layer 181 (e.g., a pre-metal dielectric [PMD] layer) by a drain contact 128. The drain contact 128 may pass through the first insulating layer 181. In addition, the drain metal 126 and the drain contact 128 preferably include a conductive metal such as copper, aluminum, or tungsten. However, the scope of the present disclosure is not limited to the above examples.

In addition, a body region 130 may be in the substrate 101. The body region 130 may comprise a first conductivity type impurity region and may surround a source 132 and a body contact 138, which will be described later. The source 132 may be in the body region 130 and/or in the substrate 101 and may comprise, for example, a heavily doped second conductivity type impurity region. The source 132 may be electrically connected to a source metal (or electrode) 134 by a source contact 136. Like the drain contact 128, the source contact 136 may pass through the first insulating layer 181. In addition, the source metal 134 and the source contact 136 preferably include a conductive metal such as copper, aluminum, or tungsten. However, the scope of the present disclosure is not limited to the above examples. In addition, the source metal 134 may extend laterally on the first insulating layer 181, but may not cross a gate electrode 140 below the source metal 134.

The body contact 138 may be in the body region 130. The body contact 138 may be in contact with the source 132. The body contact 138 may comprise a first conductivity type impurity region, and preferably has a higher dopant concentration than the body region 130. The body contact 138 may provide a path through which excess carriers in the drift region 120 escape from the device 1. The body contact 138 may extend between a pair of adjacent gate electrodes 140 in a bar shape along the extension direction of the electrodes 140. Alternatively, a plurality of body contacts 138 may be spaced apart from each other (e.g., in an island shape). Alternatively, a plurality of body contacts 138 may extend along the separation direction between adjacent gate electrodes 140 and be spaced apart from each other in the direction orthogonal to the separation direction. However, the scope of the present disclosure is not limited to specific examples.

The gate electrode 140 may be on the substrate 101. In detail, the gate electrode 140 may be between the drain 124 and the source 132 in or over the active region. The gate electrode 140 may be on or over a channel (e.g., in the substrate 101). The channel may be turned on or off in response to a voltage applied to the gate electrode 140. The gate electrode 140 may comprise a conductive polysilicon, a metal, a conductive metal nitride, or a combination thereof, and may be formed by chemical vapor deposition (CVD), physical vapor deposition (PVD), atomic layer deposition (ALD), metalorganic atomic layer deposition (MOALD), or metalorganic chemical vapor deposition (MOCVD). In addition, a gate insulating layer 142 may be between the gate electrode 140 and the substrate 101. The gate insulating layer 142 may comprise a silicon dioxide layer, a high-k dielectric layer, or a combination thereof. The gate insulating layer 142 may be formed by ALD, CVP, or PVD.

In addition, each side surface of the gate electrode 140 and the gate insulating layer 142 may be covered by a gate spacer 144. The gate spacer 144 may comprise an oxide (e.g., silicon dioxide), a nitride (e.g., silicon nitride), or a combination thereof. The body region 130 and/or the source 132 may be formed by ion implantation using the gate electrode 140 and the gate spacer 144 as a hard mask, although it/they may also be formed using a patterned photoresist as a mask.

The gate field plate 160 may be below the gate electrode 140 and on the substrate 101. The gate field plate 160 may prevent electric field concentration at an edge of the gate electrode 140. The gate field plate 160 may comprise, for example, an STI structure, a local oxidation of silicon (LOCOS) structure, or a tapered oxide (e.g., silicon dioxide). However, the scope of the present disclosure is not limited to specific examples. The gate field plate 160 may extend to the drain 124.

A metal field plate 170 may be over the gate electrode 140, preferably between the gate electrode 140 and the source metal 134. That is, the metal field plate 170 may be in the first insulating layer 181. Preferably, the metal field plate 170 is not in contact with the gate electrode 140 and is not in physical contact with the source metal 134, although it may be electrically connected to the source metal 134 by a field plate contact 137. Also, the metal field plate 170 is preferably electrically or physically connected to the source contact 136 adjacent thereto.

In addition, the metal field plate 170 preferably extends over the gate electrode 140 and may cross the gate electrode 140. That is, the metal field plate 170 may overlap an edge of the gate electrode 140 adjacent to the drain 124. The metal field plate 170 may comprise a conductive layer. Preferably, the metal field plate 170 has a smaller thickness than the source metal 134 and/or the drain metal 126, and is not physically or electrically connected to the drain metal 126 or the drain contact 128.

Here, the metal field plate 170 may include, for example, a Ni—Cr alloy, a Cr—Si alloy, tantalum nitride (TaN), a conductive chromium-silicon nitride (CrSiN), a conductive chromium-silicon oxide (CrSiO), or titanium nitride (TiN), and preferably has a thickness of 30 Å to 1000 Å. Preferably, the metal field plate 170 is formed substantially simultaneously with a thin film resistor 230, which will be described later, in the same process step[s] or sequence. This is advantageous in that a separate process for forming the metal field plate 170 is not necessary. Therefore, the metal field plate 170 may have substantially the same material and thickness as the thin film resistor 230. That is, like the thin film resistor 230, the metal field plate 170 may comprise an intermetallic compound or alloy having a low temperature coefficient ratio (TCR) in the form of a thin film.

Figure 2:
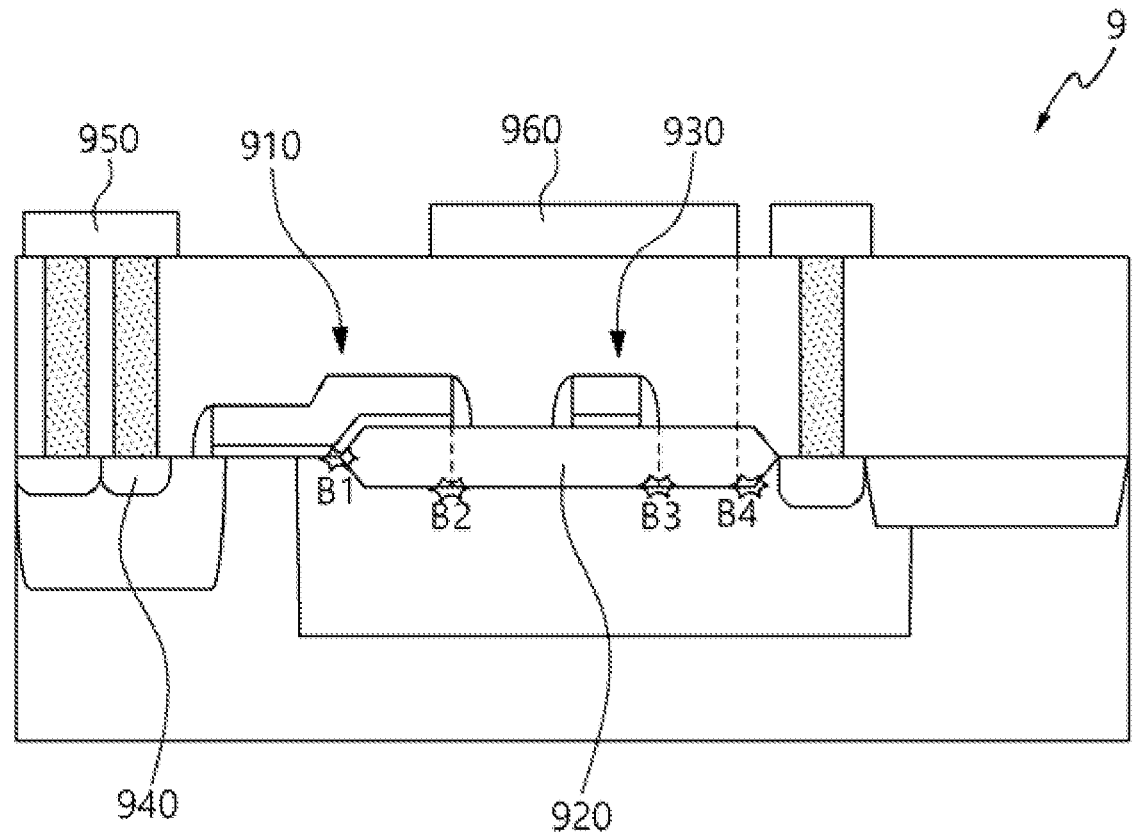
Figure 3:
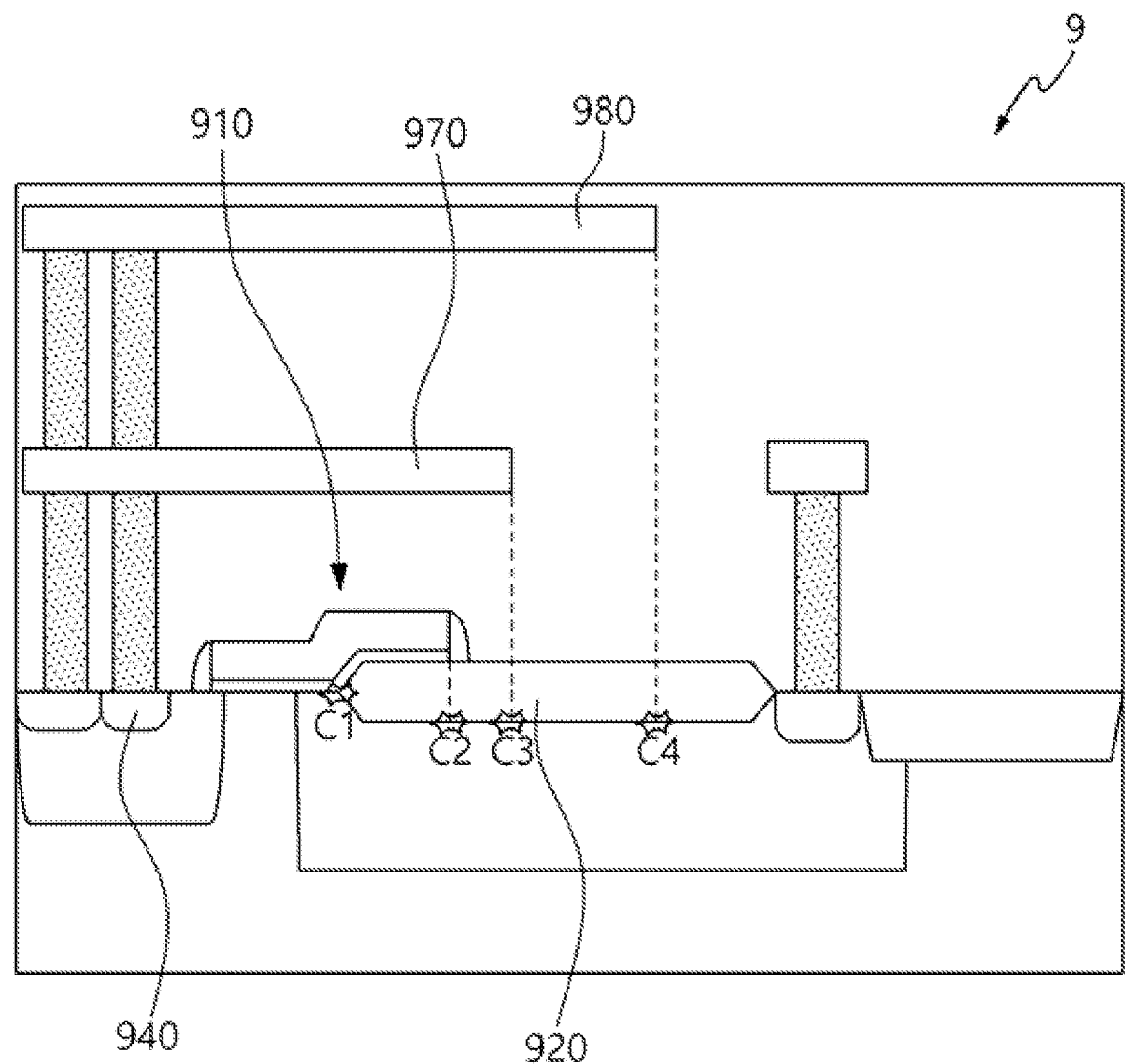

FIGS. 1 to 3 are cross-sectional views illustrating a conventional high voltage semiconductor device 9.

Hereinafter, the structure and problems of the conventional high voltage semiconductor device 9 for electric field dispersion, and a high voltage semiconductor device 1 according to embodiment(s) of the present disclosure for solving the problems, will be described.

Referring to FIG. 1, in a region of the conventional high voltage semiconductor device 9 having a low operating voltage (Vop) (e.g., equal to or less than 30 V), a gate field plate 920 below a gate electrode 910 reduces or prevents electric field concentration at an edge of the gate electrode 910. With this structure, peak electric fields are generated at an edge A1 of the gate field plate 920 below the gate electrode 910 and at an edge A2 of the gate electrode 910, so the electric field is dispersed.

In addition, referring to FIG. 2, in a region of the conventional high voltage semiconductor device 9 having a medium operating voltage (Vop) (e.g., 40 V to 100 V), a gate field plate 920 is below a gate electrode 910, a poly field plate 930 is on the gate field plate 920, and a source metal 950 is electrically connected to a source 940. The source metal 950 may extend laterally. Alternatively, as illustrated, the source metal 950 may be physically connected to a source contact. and a metal field plate 960 may be electrically connected to and spaced apart from the source metal 950. With this structure, peak electric fields may be generated at an edge B1 of the gate field plate 920 below the gate electrode 910, an edge B2 of the gate electrode 910, an edge B3 of the poly field plate 930, and an edge B4 of the metal field plate 960, so the electric field is dispersed.

Lastly, referring to FIG. 3, in a region of the conventional high voltage semiconductor device 9 having a high operating voltage (Vop) (e.g., equal to or greater than 100 V), an additional source metal 980 (hereinafter referred to as a second source metal 980) is on or over a source metal 970 (hereinafter referred to as a first source metal 970). The second source metal 980 may extend farther than the first source metal 970 (e.g., over the gate field plate 920). With this structure, peak electric fields may be generated at an edge C1 of a gate field plate 920 below a gate electrode 910, an edge C2 of the gate electrode 910, an edge C3 of the first source metal 970, and an edge C4 of the second source metal 980, so the electric field is dispersed.

As described above, in the conventional high voltage semiconductor device 9, additional configurations or structures may be formed in separate processes in order to achieve peak electric field dispersion. This may decrease process efficiency. That is, additional processes are used to form the poly field plate 930 on the gate field plate 920, the metal field plate 960, and the second source metal 980.

Referring to FIG. 4, in order to solve the above problem, the high voltage semiconductor device 1 according to embodiment(s) of the present disclosure includes a metal field plate 170 between the gate electrode 140 and the source metal 134 for electric field dispersion. The metal field plate 170 may be formed substantially simultaneously with the thin film resistor 230, thereby facilitating electric field dispersion without using additional processing. That is, in the present disclosure, an electric field may be dispersed at positions overlapping an edge D1 of the gate field plate 160, an edge D2 of the gate electrode 140, and an edge D3 of the metal field plate 170.

The first insulating layer 181 may be on the substrate 101 to cover the gate electrode 140. As described above, the drain contact 128 and the source contact 136 may pass through the first insulating layer 181. The first insulating layer 181 may comprise, for example, a plurality of oxide layers (e.g., doped or undoped silicon dioxide) and optionally one or more silicon nitride layers. The drain metal 126 and the source metal 134 may be on the first insulating layer 181.

In addition, a second insulating layer 183 may be formed on the first insulating layer 181 to cover the drain metal 126 and the source metal 134. Here, the second insulating layer 183 may include one or more of the same materials as the first insulating layer 181, but the scope of the present disclosure is not limited thereto.

A metal silicide layer (not illustrated) may be on the drain 122, the source 132, the gate electrode 140, and the body contact 138. In general, in a MOSFET device, a self-aligned silicide process using a metal layer such as cobalt (Co), nickel (Ni), or titanium (Ti) may form a silicide layer (not illustrated) in order to improve contact resistance and thermal stability.

In addition, a wiring layer 210 may be on the first insulating layer 181, over the device isolation layer 150. Respective wiring layers 211 and 213 may be on the first insulating layer 181 and the second insulating layer 183. That is, one or more first wiring layers 211 may be on the first insulating layer 181 and spaced apart from each other, and one or more second wiring layers 213 may be on the second insulating layer 183 and spaced apart from each other. Also, each of the first wiring layers 211 and an overlapping second wiring layer 213 may be electrically or physically connected to each other by a conductive via or plug 220. Although in the drawings the wiring layer 210 is illustrated as comprising the first wiring layers 211 and the second wiring layers 213 to form a one- or two-layered structure, it should be noted that the scope of the present disclosure is not limited thereto.

In addition, one or more thin film resistors 230 may be electrically or physically connected to wires in the wiring layer 210. The thin film resistor 230 may include, for example, a NiCr alloy, a CrSi alloy, TaN, CrSiN, CrSiO, or TiN, and preferably has a thickness of 30 Å to 1000 Å. The thin film resistor 230 is preferably connected to one or more of the first wiring layers 211 by a via or contact 240 below the first wiring layer 211. That is, the thin film resistors 230 may be in the first insulating layer 181 and at substantially the same height as the metal field plate 170. The thin film resistors 230 may function to suppress the flow of charges, thereby controlling the amount of current passing through the wires 211.

FIGS. 5 to 19 are cross-sectional views illustrating structures formed during an exemplary method of manufacturing a high voltage semiconductor device according to an embodiment of the present disclosure.

Hereinafter, the method of manufacturing the high voltage semiconductor device according to embodiment(s) of the present disclosure will be described in detail with reference to the accompanying drawings.

Figure 5:
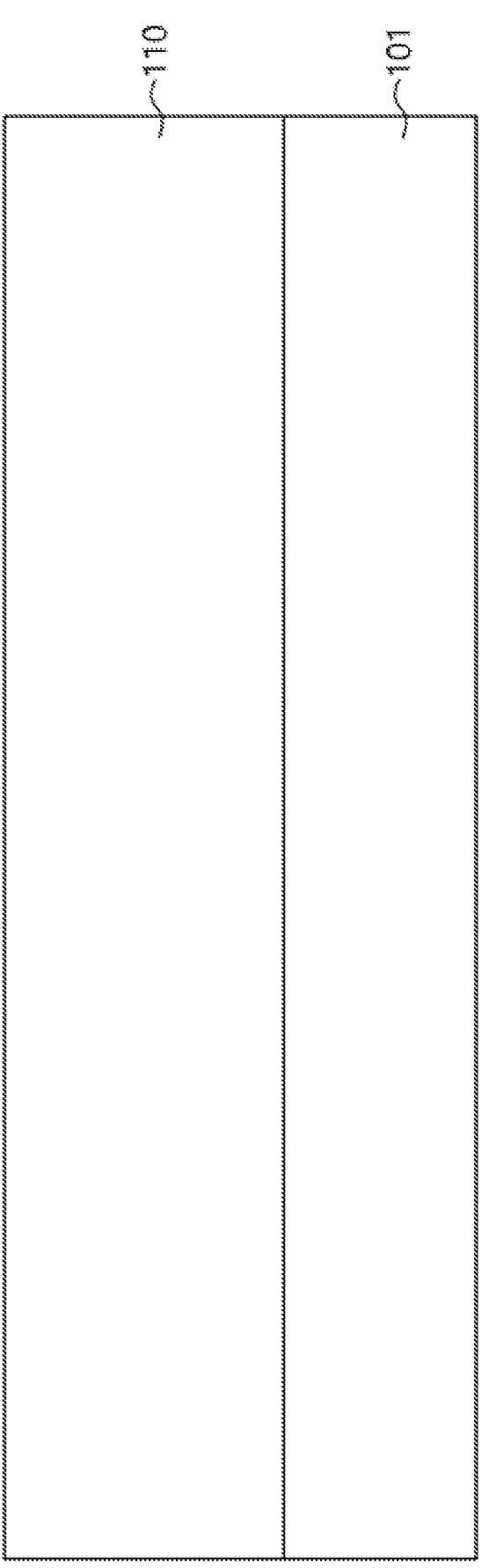
FIGS. 5 to 19 are cross-sectional views illustrating struc- tures formed during an exemplary method of manufacturing a high voltage semiconductor device according to one or more embodiments of the present disclosure.

Referring to FIG. 5, first, an epitaxial layer 110 may be grown on a substrate 101. The substrate 101 may comprise a single-crystal silicon substrate having a first conductivity type, which may have a P-type diffusion region or a P-type epitaxial layer thereon. The epitaxial layer 110 may be formed by epitaxial growth, and optionally, sequential epitaxial growth of a lower epitaxial layer and an upper epitaxial layer. The epitaxial layer 110 may comprise, for example, a first conductivity type epitaxial layer. The substrate 101 may hereinafter be understood as including epitaxial layer 110.

Figure 6:
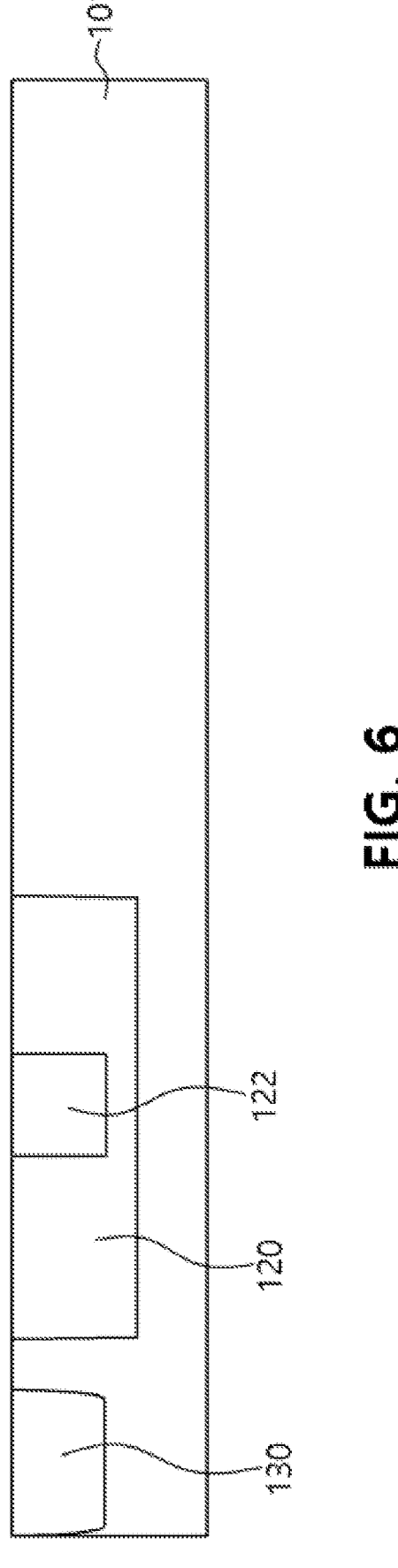

Then, referring to FIG. 6, a drift region 120 and a body region 130 may be formed in the substrate 101 (specifically, in the epitaxial layer 110). The drift region 120 may comprise a second conductivity type impurity region, and the body region 130 may comprise a first conductivity type impurity region. Both the drift region 120 and the body region 130 may be formed by ion implantation (e., through a corresponding photolithographically-patterned photoresist).

After that, a drain extension 122 may be formed in the drift region 120. The drain extension 122 may be formed by forming a mask pattern (e.g., a photolithographically-patterned photoresist; not illustrated) exposing the area of the epitaxial layer 110 corresponding to the drain extension 122, and implanting second conductivity type impurity ions.

Figure 7:
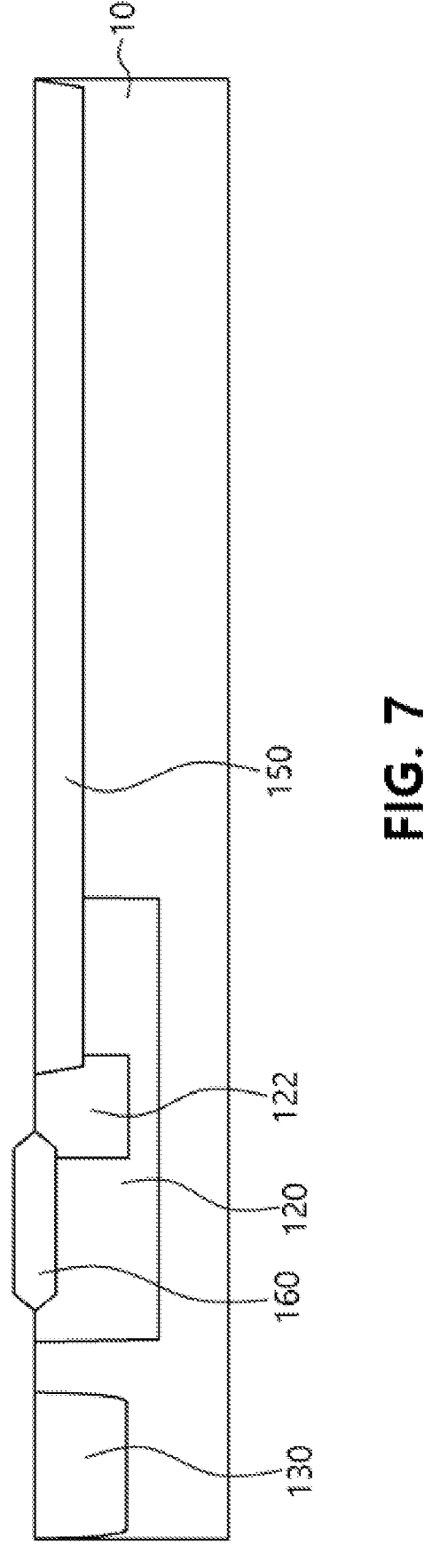

Then, referring to FIG. 7, an active region may be defined at least in part by forming a device isolation layer 150. As described above, the device isolation layer 150 may be formed by shallow trench isolation (STI). Also, a gate field plate 160 may be formed, optionally in the same STI process. Alternatively, the gate field plate 160 may be formed by, for example, local oxidation of silicon (LOCOS), or a tapered oxide process.

Figure 8:
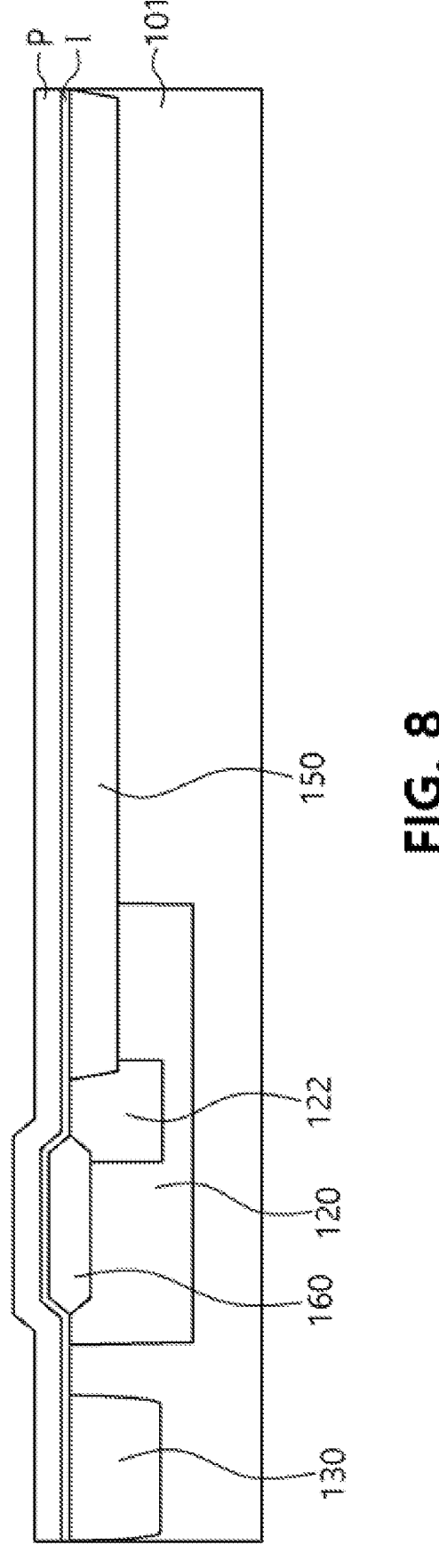
Figure 9:
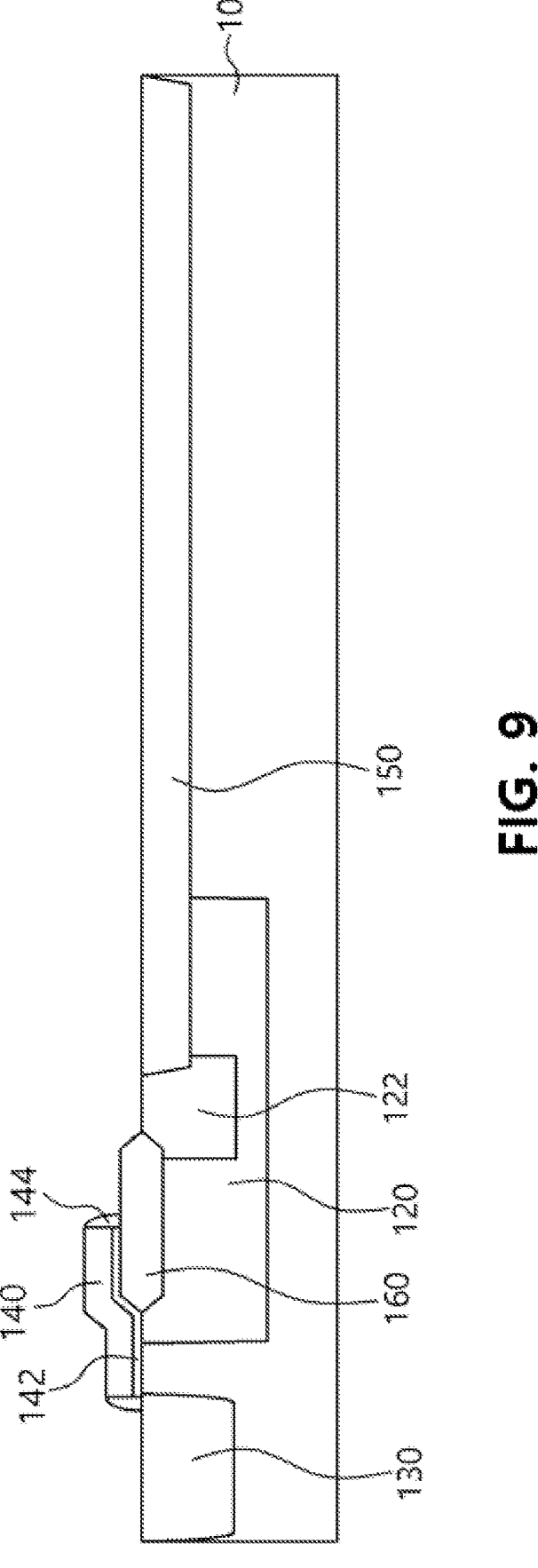

Then, referring to FIG. 8, an insulating layer I for forming a gate insulating layer 142 may be formed on the substrate 101 by blanket deposition (e.g., chemical vapor deposition [CVD] or atomic layer deposition [ALD]) or thermal growth, and a gate layer P for forming a gate electrode 140 may be deposited on the insulating layer I. The gate layer P may include, for example, a heavily-doped polysilicon, a metal, a conductive metal nitride, or a combination thereof. The insulating layer I may include a silicon dioxide layer, a high-k dielectric layer, or a combination thereof.

Then, the gate electrode 140 and the gate insulating layer 142 may be formed. In detail, referring to FIG. 9, a mask pattern (not illustrated) for etching the gate layer P and the insulating layer I may be formed by deposition of a photoresist, photolithographic patterning, and development on the gate layer P. and then the gate layer P and the insulating layer I may be sequentially etched. As a result, the gate electrode 140 may be formed.

After that, a gate spacer 144 may be formed on the side surfaces of the gate electrode 140 by depositing one or more thin insulating layers on the gate electrode 140 and the substrate 101 by, for example, a chemical vapor deposition (CVD) process and anisotropically dry etching the one or more thin insulating layers.

Figure 10:
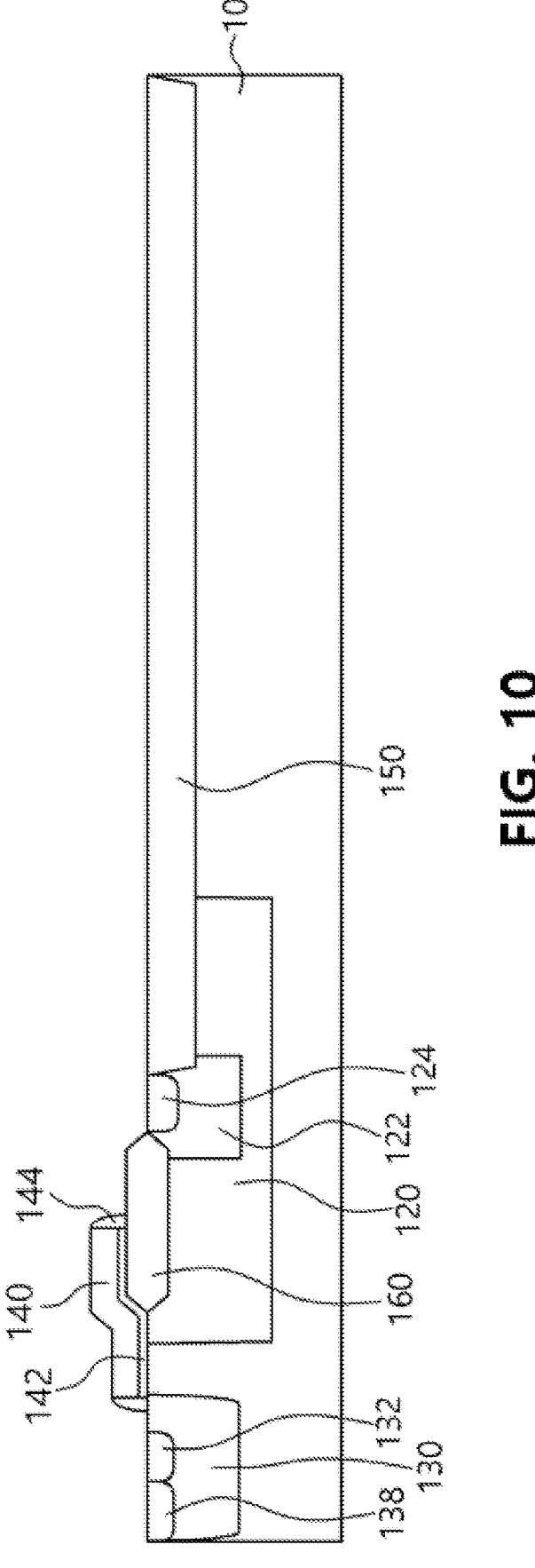

Then, referring to FIG. 10, a drain 124 and a source 132 may be formed. The drain 124 and the source 132 may comprise heavily doped second conductivity type impurity regions. The drain 124 and the source 132 may be formed by ion implantation, as described herein.

After that, a body contact 138 may be formed in the body region 130. The body contact 138 may be formed in the substrate 101 by ion implantation.

Figure 11:
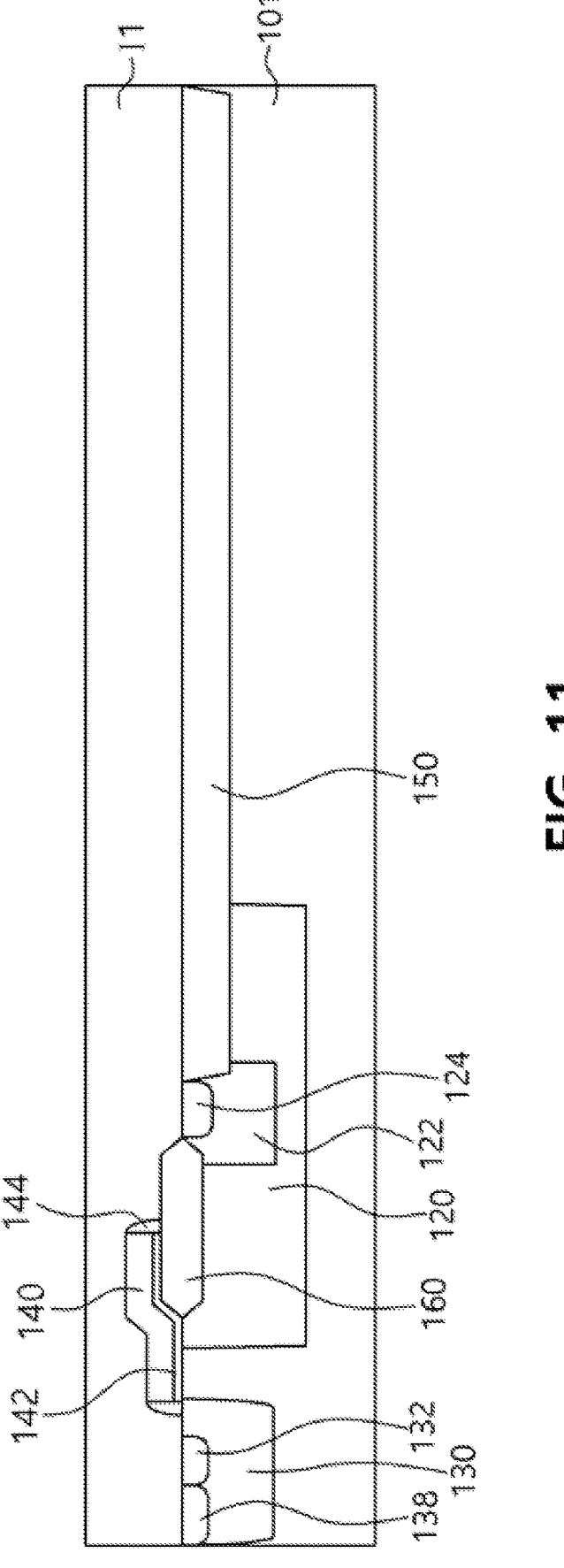

Then, referring to FIG. 11, a lower insulating layer I1 may be deposited on the surface of the substrate 101 by blanket deposition (e.g., chemical vapor deposition [CVD], physical vapor deposition [PVD], atomic layer deposition [ALD], metalorganic atomic layer deposition [MOALD], metalorganic chemical vapor deposition [MOCVD], etc.) to cover the gate electrode 140. The lower insulating layer I1 may comprise a borophosphosilicate glass (BPSG), a phosphosilicate glass (PSG), a borosilicate glass (BSG), an undoped silicate glass (USG), silicon nitride, a combination thereof, etc., but is not limited thereto. The lower insulating layer I1 may be planarized (e.g., by chemical mechanical polishing [CMP]) after deposition. The lower insulating layer I1 may have a height less than that of the corresponding first insulating layer 181.

Figure 12:
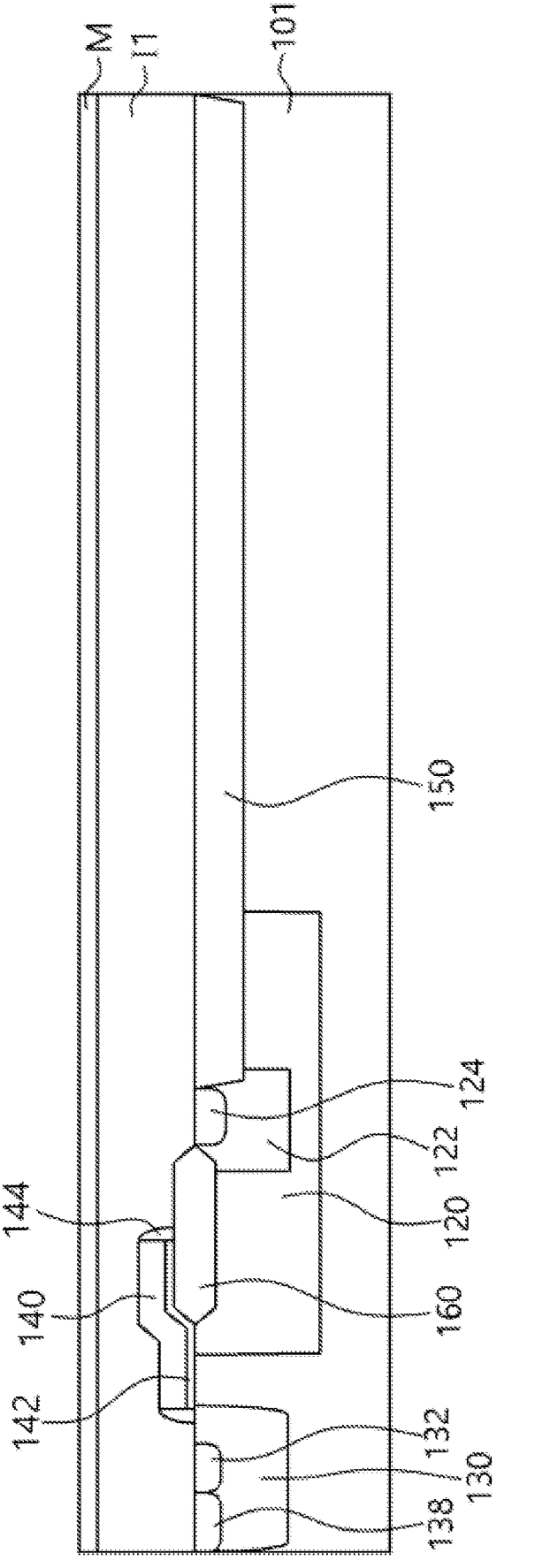

Then, a metal field plate 170 and a thin film resistor 230 may be formed on the lower insulating layer I1. Referring to FIG. 12, for example, the metal field plate 170 and the thin film resistor 230 may be formed by depositing a thin metal or conductive metal alloy or compound (e.g., a refractory metal nitride or silicide) film M on the lower insulating layer I1, and then etching the thin film M after forming a mask pattern (not illustrated) thereon. Here, the metal field plate 170 preferably extends over the gate electrode 140 and/or has a length sufficient to cross the gate electrode 140.

Figure 13:
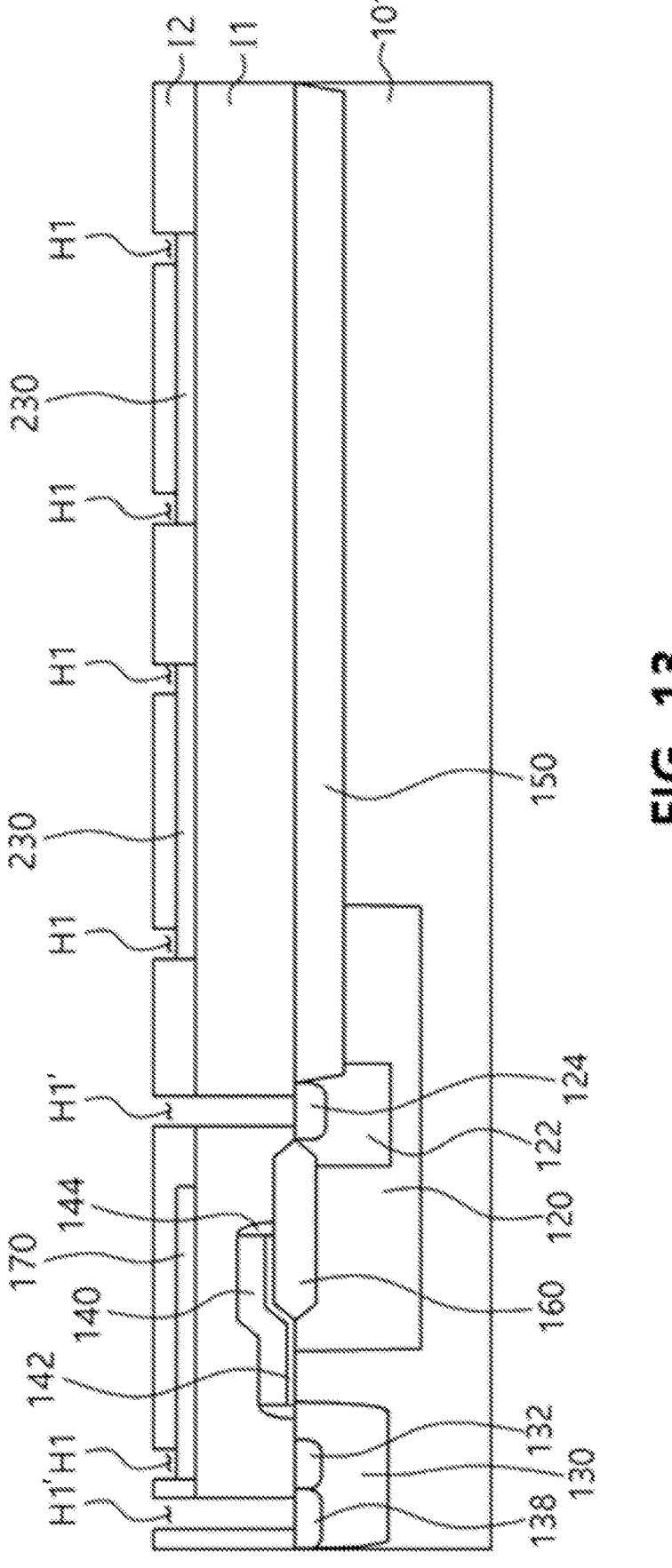

Then, referring to FIG. 13, an upper insulating layer I2 may be formed on the lower insulating layer I1 by blanket deposition (e.g., CVD, PVD, ALD, MOALD, MOCVD, etc.) to cover the metal field plate 170 and the thin film resistor 230. The upper insulating layer I2 may comprise a BPSG, a PSG, a BSG, a USG, silicon nitride, a silicon dioxide layer derived from tetraethyl orthosilicate (TEOS), or a combination thereof, but is not limited thereto. The upper insulating layer I2 may be planarized (e.g., by CMP) after deposition. The upper insulating layer I2 may have a thickness of 20-50% of the thickness of the lower insulating layer I1, 2-5 times the thickness of the metal field plate 170 and thin film resistor 230, etc. As a result, the first insulating layer 181 may be formed. After that, first contact holes H1 and H1' may be formed in the upper insulating layer I2 (e.g., by photolithographically patterning a photoresist and etching the exposed areas of the first insulating layer 181). Here, the first contact holes H1 may be spaced apart from each other in the upper insulating layer I2, exposing the metal field plate 170 and the thin film resistors 230, and the contact holes H1' may be spaced apart from each other in the first insulating layer 181, exposing the drain 124 and the body contact 138. The first contact holes H1 may be holes for vias or contacts 137 and 240, and the contact holes H1' may be holes for the drain contact 128 and the source contact 136.

Figure 14:
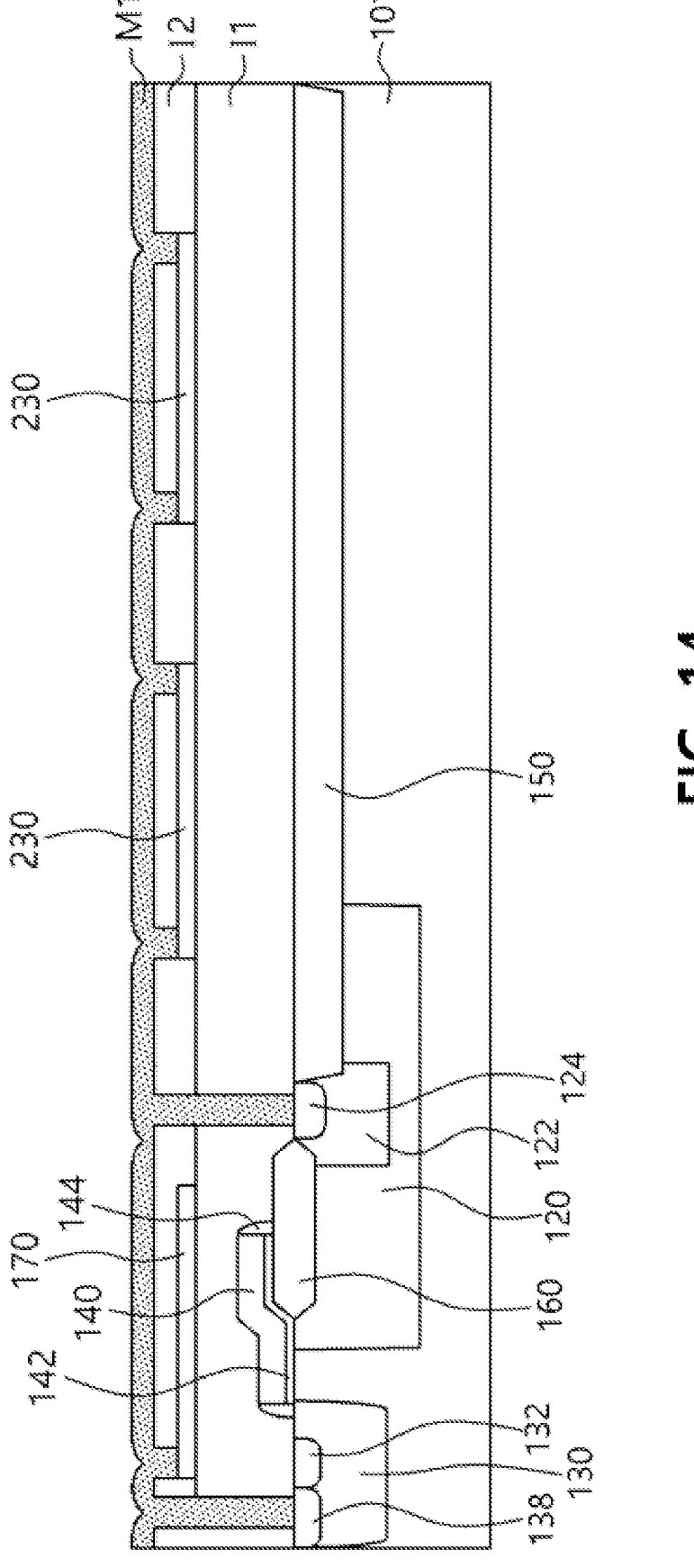

Then, referring to FIG. 14, a first conductive layer M1 may be formed by blanket and/or conformal deposition on the upper insulating layer I2 and in the first contact holes H1 and H1'. The first conductive layer M1 may include a conductive liner such as titanium, titanium nitride, hafnium and/or hafnium nitride on the upper insulating layer I2 and in the contact holes H1 and H1', and a conductive metal such as copper, aluminum, or tungsten thereon. The excess first conductive layer M1 on the upper insulating layer I2 may be removed by CMP or etchback (e.g., nonselective etching). As a result, the drain contact 128, the source contacts 136, and the vias or contacts 137 and 240 may be completed.

Figure 15:
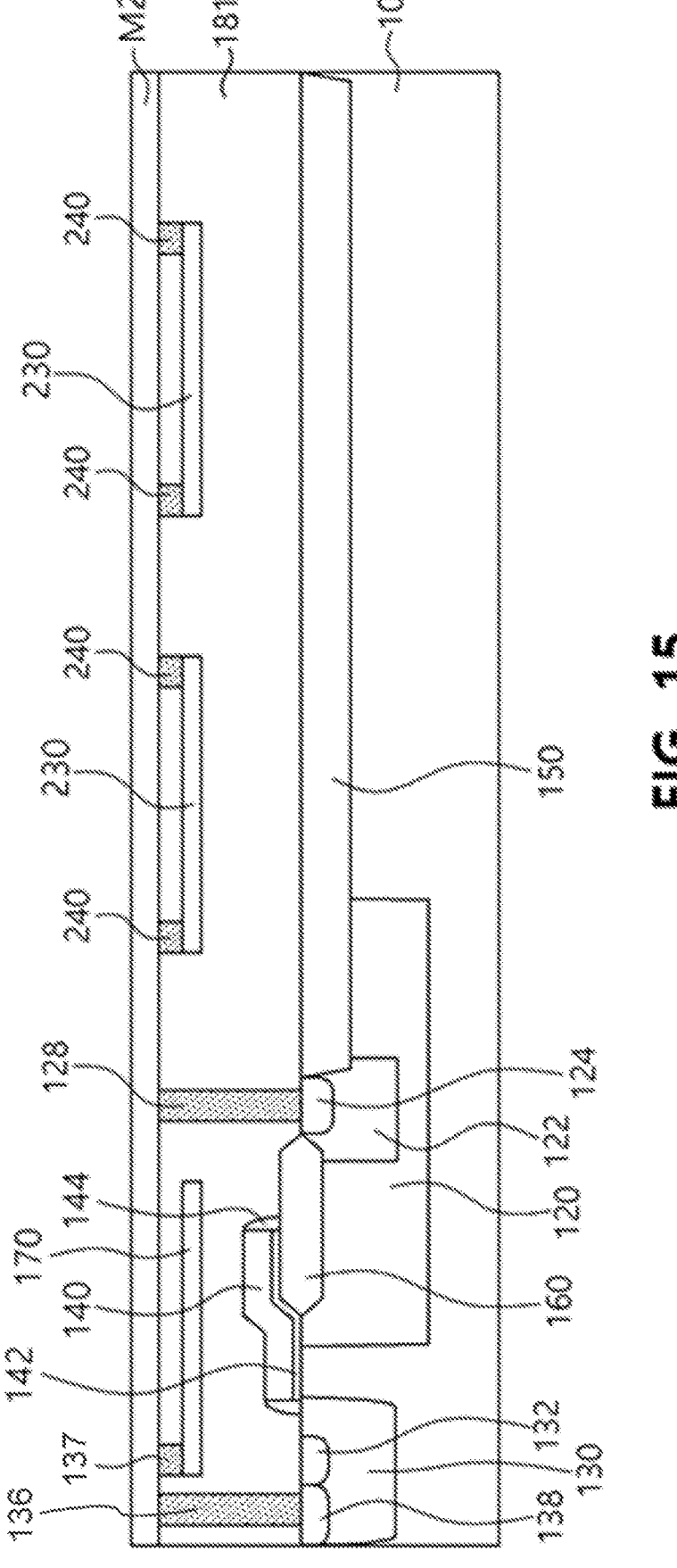

Then, referring to FIG. 15, a second conductive layer M2 is blanket-deposited on the first insulating layer 181. Subsequently, a drain metal 126, a source metal 134, and first wiring layers 211 is formed by forming mask pattern (not illustrated) thereon, and etching the exposed areas of the second conductive layer M2 (e.g., by dry etching).

Figure 16:
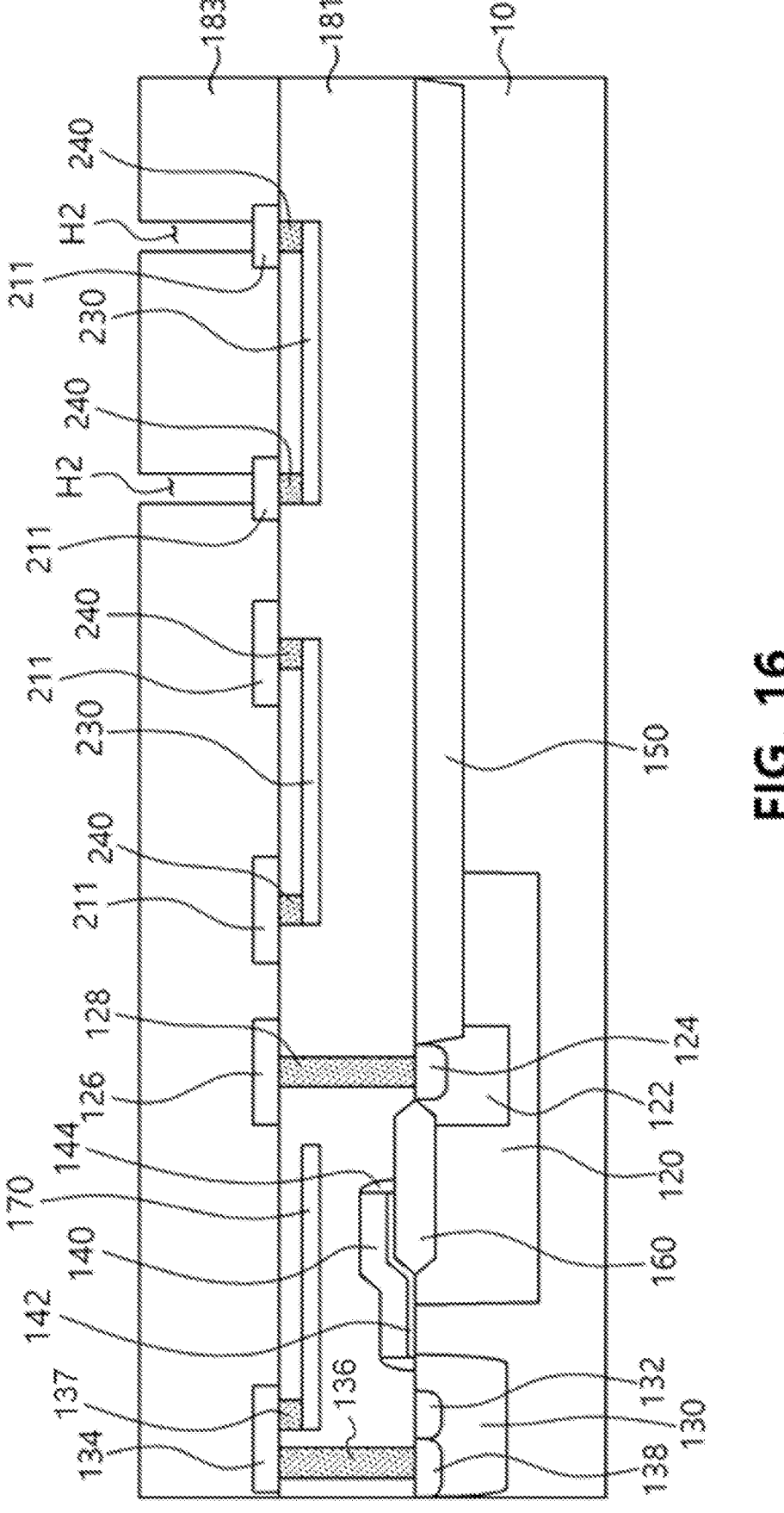

Then, referring to FIG. 16, a second insulating layer 183 may be formed on the first insulating layer 181 by blanket deposition, the second insulating layer 183 may be planarized (e.g., by CMP), and second contact holes H2 may be formed in the second insulating layer 183 in the same manner as the first contact holes H1. The second insulating layer 183 may comprise a BPSG, a PSG, a BSG, a USG, silicon nitride, a silicon dioxide layer derived from tetraethyl orthosilicate (TEOS), or a combination thereof, but is not limited thereto. The second contact holes H2 may expose the first wiring layers 211, and optionally (although not shown), the drain metal 126 and source metal 134. The second contact holes H2 may be holes for vias or plugs 220.

Figure 17:
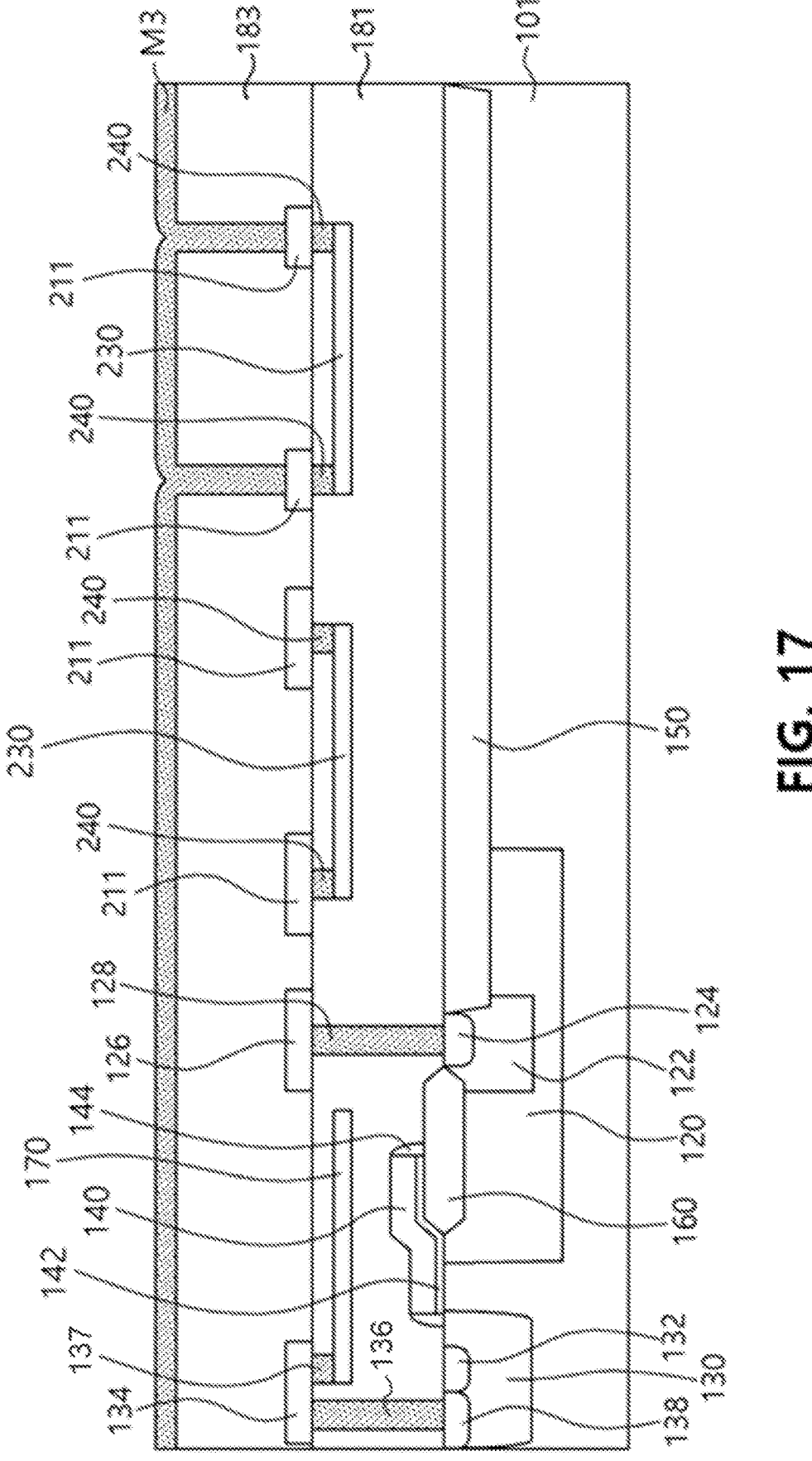
Figure 18:
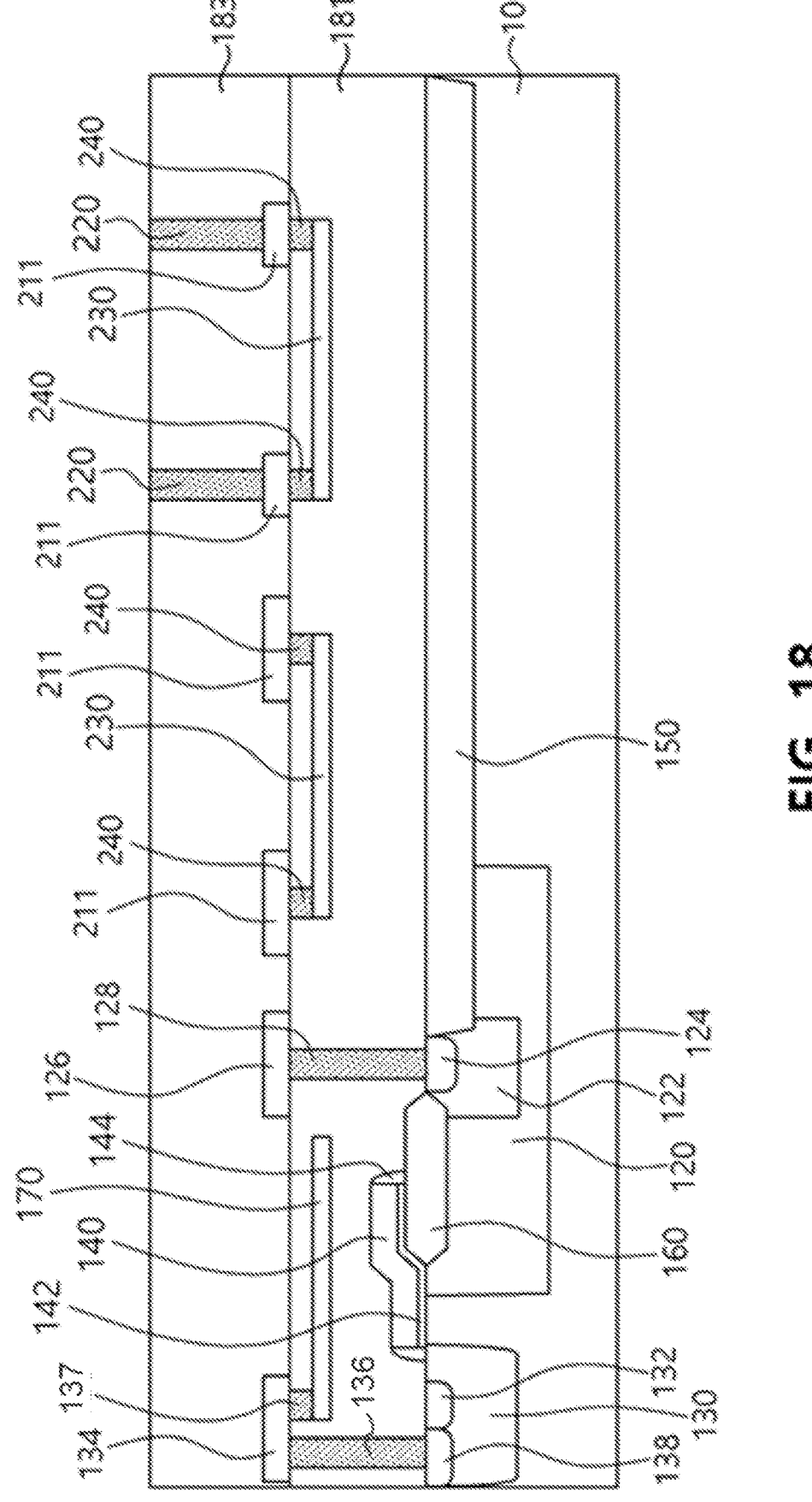

Then, referring to FIG. 17, a third conductive layer M3 may be blanket- and/or conformally deposited onto the second insulating layer 183 and may fill the second contact holes H2. The excess third conductive layer M3 on the second insulating layer 183 may be removed by CMP or etchback (e.g., nonselective etching). As a result, the vias or plugs 220 may be completed (FIG. 18).

Figure 19:
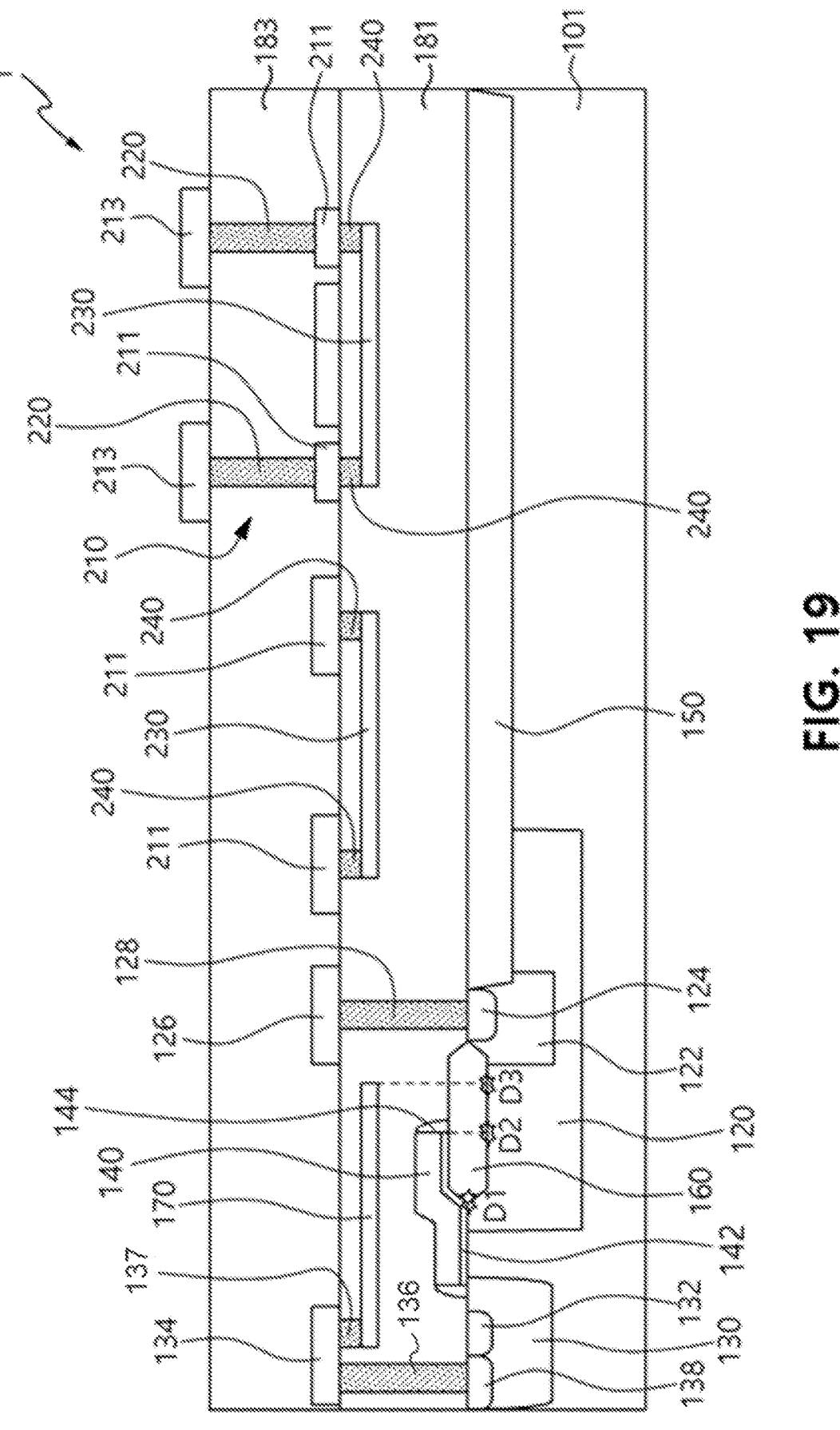

Finally, referring to FIG. 19, a fourth conductive layer M4 may be blanket-deposited on the second insulating layer 183, and then patterned and etched using a mask pattern (not illustrated). As a result, second wiring layers 213 may be completed.

The foregoing detailed description may be merely an example of the present disclosure. Also, the inventive concept is explained by describing preferred embodiments, and may be used through various combinations, modifications, and environments. That is, the inventive concept may be changed or modified without departing from the scope of the technical idea and/or knowledge in the art. The foregoing embodiments are for illustrating various modes for implementing the technical idea of the present disclosure, and various modifications may be made therein according to specific applications and fields of use of the present disclosure. Therefore, the foregoing detailed description of the present disclosure is not intended to limit the inventive concept to the disclosed embodiments.

What is claimed is:

1. A high voltage semiconductor device comprising:
a substrate;
a drift region in the substrate;
a body region in the substrate;
a drain in the drift region;
a source in the body region;
a gate electrode on the substrate;
a first insulating layer on the substrate and covering the gate electrode;
a source contact in the first insulating layer and connected to the source;
a drain contact in the first insulating layer and connected to the drain;
a metal field plate in the first insulating layer and electrically connected to the source contact, wherein the metal field plate overlaps an edge of the gate electrode adjacent to the drain;

a first wiring layer on the first insulating layer, wherein the first wiring layer includes a source electrode connected to the source contact and a drain electrode connected to the drain contact, and the metal field plate is electrically connected to the source contact through the source electrode; and a thin film resistor in the first insulating layer and spaced apart from the metal field plate, wherein the thin film resistor has a substantially identical chemical composition and thickness as the metal field plate and is substantially at a same height as the metal field plate.

2. The high voltage semiconductor device of claim 1, further comprising a drain extension in the drift region, wherein the drain is in the drain extension.

3. The high voltage semiconductor device of claim 1, wherein the metal field plate is thinner than the source electrode.

4. The high voltage semiconductor device of claim 1, wherein the metal field plate is spaced apart from an upper surface of the gate electrode.

5. The high voltage semiconductor device of claim 1, further comprising:

a second insulating layer on the first wiring layer and the first insulating layer; and a second wiring layer on the second insulating layer.

6. The high voltage semiconductor device of claim 5, further comprising a body contact in the body region and in contact with the source.

7. The high voltage semiconductor device of claim 1, further comprising a first via or contact in the first insulating layer connecting the thin film resistor to the first wiring layer.

8. The high voltage semiconductor device of claim 7, further comprising a field plate contact in the first insulating layer connecting the metal field plate to the source electrode.

9. The high voltage semiconductor device of claim 1, further comprising a field plate contact in the first insulating layer connecting the metal field plate to the source electrode.

10. The high voltage semiconductor device of claim 1, wherein each of the metal field plate and the thin film resistor has a thickness from 30 Å to 1000 Å.

11. The high voltage semiconductor device of claim 1, wherein each of the metal field plate and the thin film resistor comprises a conductive layer.

12. The high voltage semiconductor device of claim 11, wherein the conductive layer comprises a Ni—Cr alloy, a Cr—Si alloy, tantalum nitride (TaN), a conductive chromium-silicon nitride (CrSiN), a conductive chromium-silicon oxide (CrSiO), or titanium nitride (TiN).

13. A method of manufacturing a high voltage semiconductor device, the method comprising:

forming a drift region and a body region on a substrate;

forming a device isolation layer in the substrate;

forming a gate insulating layer and a gate electrode on the substrate;

forming a drain in the drift region and a source in the body region;

forming a lower insulating layer on the substrate to cover the gate electrode;

forming a metal field plate and a thin film resistor spaced apart from the metal field plate on the lower insulating layer, wherein the metal field plate overlaps an edge of the gate electrode adjacent to the drain, and the thin film resistor has a substantially identical chemical composition and thickness as the metal field plate;

forming an upper insulating layer on the lower insulating layer to cover the metal field plate and the thin film resistor;

forming (i) a source contact and a drain contact in the upper and lower insulating layers and (ii) a first via or contact and a field plate contact spaced apart from the source contact and the drain contact in the upper insulating layer, the field plate contact contacting the metal field plate; and forming a source metal, a drain metal, and a first wiring layer spaced apart from each other on the upper insulating layer, the source metal contacting the field plate contact and the source contact, and the drain metal contacting the drain contact.

14. The method of claim 13, wherein each of the metal field plate and the thin film resistor has a thickness from 30 Å to 1000 Å.

15. The method of claim 13, wherein each of the metal field plate and the thin film resistor comprises a conductive layer.

16. The method of claim 15, wherein the conductive layer comprises a Ni—Cr alloy, a Cr—Si alloy, tantalum nitride (TaN), a conductive chromium-silicon nitride (CrSiN), a conductive chromium-silicon oxide (CrSiO), or titanium nitride (TiN).

17. The method of claim 13, further comprising forming a drain extension in the drift region, wherein the drain is in the drain extension.

18. The method of claim 13, wherein the metal field plate is thinner than the source electrode.

19. The method of claim 13, further comprising:

forming a second insulating layer on the first wiring layer and the first insulating layer; and forming a second wiring layer on the second insulating layer.

* * * * *